United States Patent
Song

(10) Patent No.: US 7,268,010 B2
(45) Date of Patent: Sep. 11, 2007

(54) METHOD OF MANUFACTURING AN LED

(75) Inventor: Wen Joe Song, Chung Ho (TW)

(73) Assignee: Kingbright Electronic Co., Ltd., Taipei Hsien (TW)

( * ) Notice: Subject to any disclaimer, the term of this patent is extended or adjusted under 35 U.S.C. 154(b) by 118 days.

(21) Appl. No.: 11/098,870

(22) Filed: Apr. 5, 2005

(65) Prior Publication Data

US 2006/0079014 A1 Apr. 13, 2006

(30) Foreign Application Priority Data

Oct. 8, 2004 (TW) .............................. 93130540 A

(51) Int. Cl.
*H01L 21/00* (2006.01)
(52) U.S. Cl. .................. 438/91; 438/30; 438/106; 257/E25.032; 257/E21.053; 257/E21.352
(58) Field of Classification Search .................. 438/30, 438/22, 104, 106, 112, 118, 124, 126, 127, 438/91, 983
See application file for complete search history.

(56) References Cited

U.S. PATENT DOCUMENTS 6,774,478 B2 * 8/2004 Eto et al. ..................... 257/686
6,965,191 B2 * 11/2005 Koike et al. ................. 313/112

2005/0127377 A1 6/2005 Arndt et al.
2006/0157828 A1 7/2006 Sorg

FOREIGN PATENT DOCUMENTS

| DE | 101 09 349 A1 | 9/2002 |
| DE | 697 13 849 T2 | 2/2003 |
| DE | 102 41 989 A1 | 6/2003 |
| EP | 0 834 604 A1 | 4/1998 |
| EP | 1 065 712 A1 | 1/2001 |
| EP | 0 083 602 A2 | 3/2001 |
| WO | WO 2004/027882 A2 | 4/2004 |

* cited by examiner

*Primary Examiner*—David Nhu
(74) *Attorney, Agent, or Firm*—Patterson, Thuente, Skaar & Christensen, P.A.

(57) ABSTRACT

The present invention related to a method of manufacturing an LED, including the steps of: first, forming a tape coppery metal strip; then, continuously pressing circuits on the tape coppery metal strip so as to form a carrier having circuit patterns of electric contacts on which the diode dies can be placed; next, electroplating a plurality of metal layers on the surface of the carrier; then, performing continuous injection molding on the carrier so as to form a protector having a designated shape; and curing and fixing the diode die on the carrier to connect to the terminal contact of the carrier via metal wire. A conductive or non-conductive adhesive is dropped onto the bonding position between the metal wire and the terminal of the carrier, and a soft paste is Anther applied to cover the diode die, the metal wire and the terminal.

19 Claims, 9 Drawing Sheets

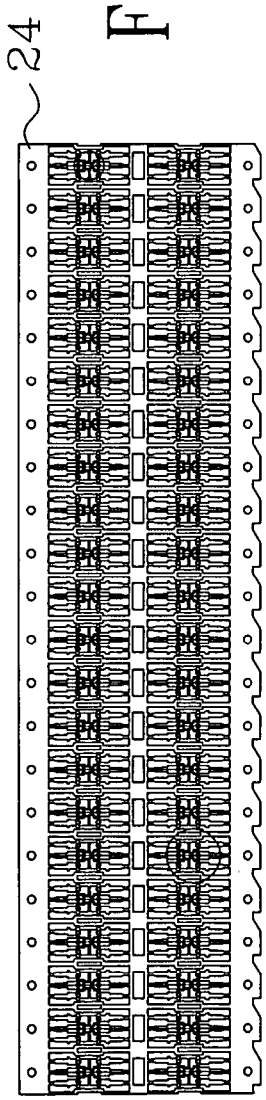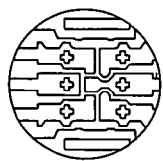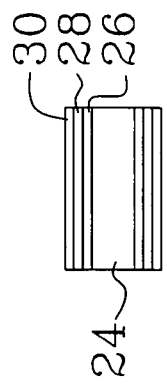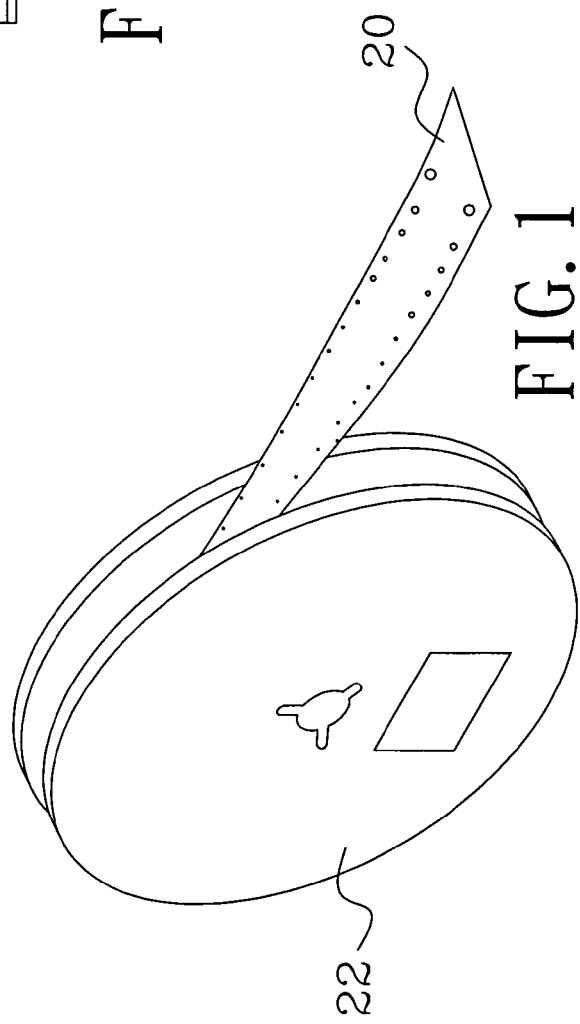

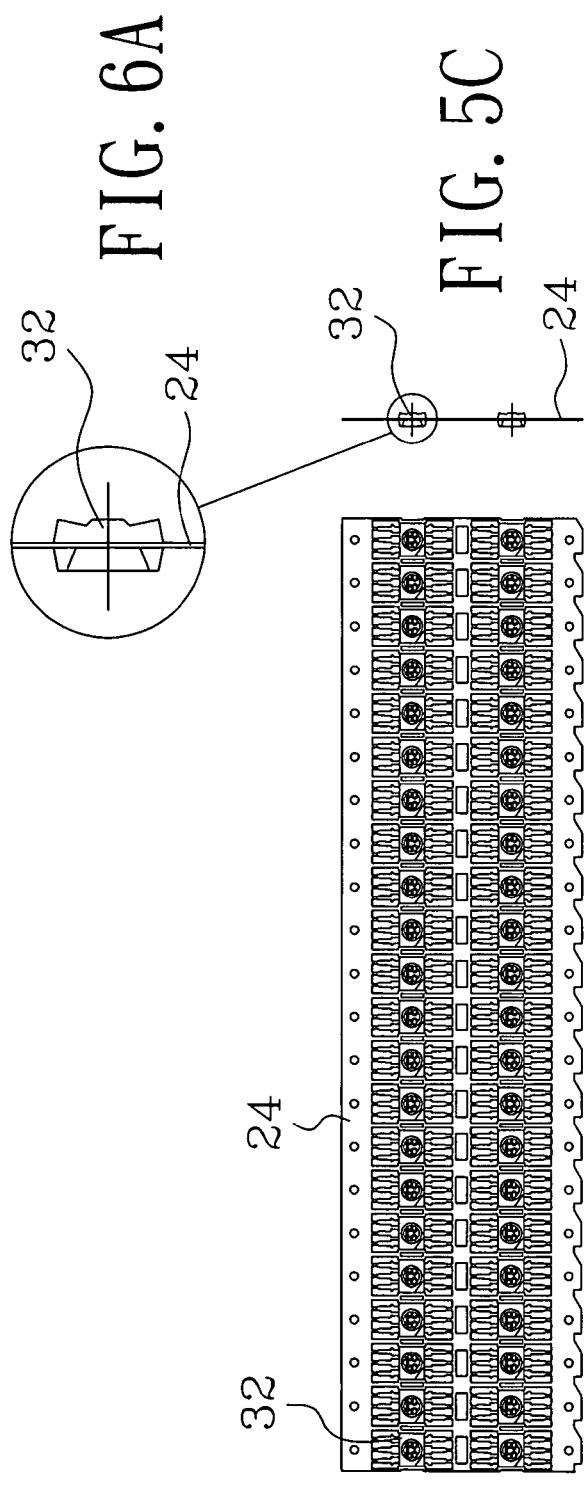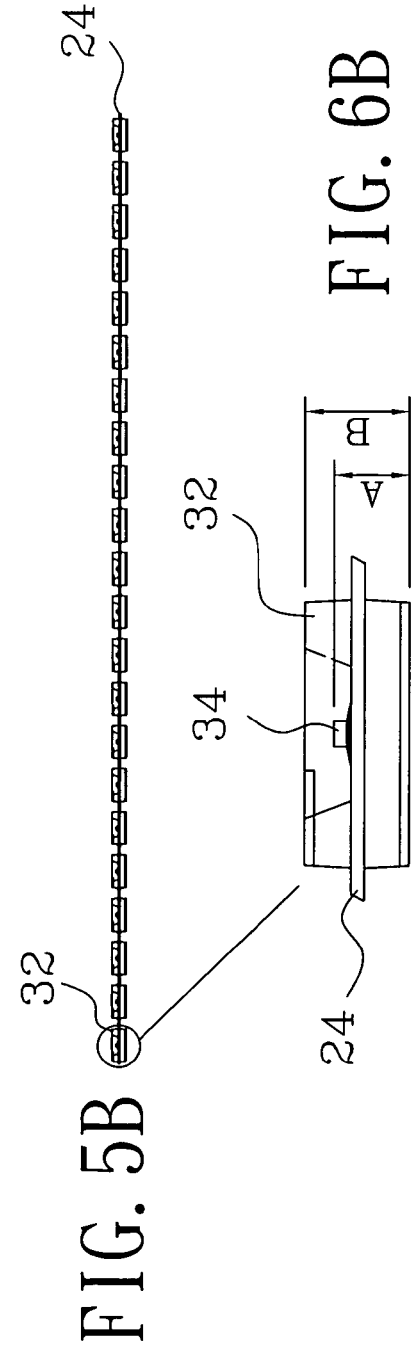

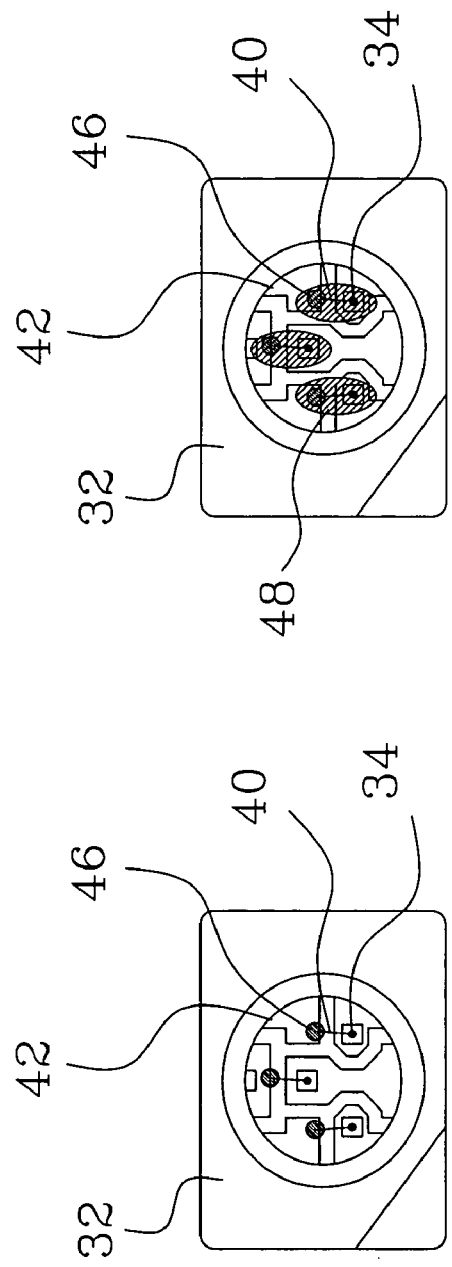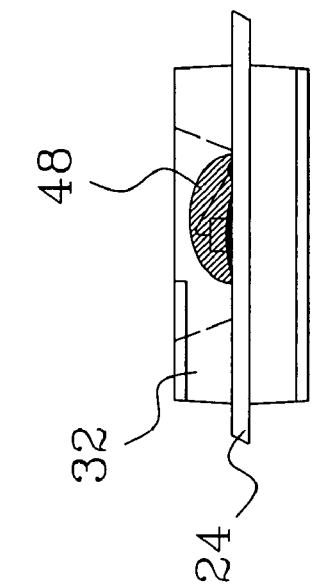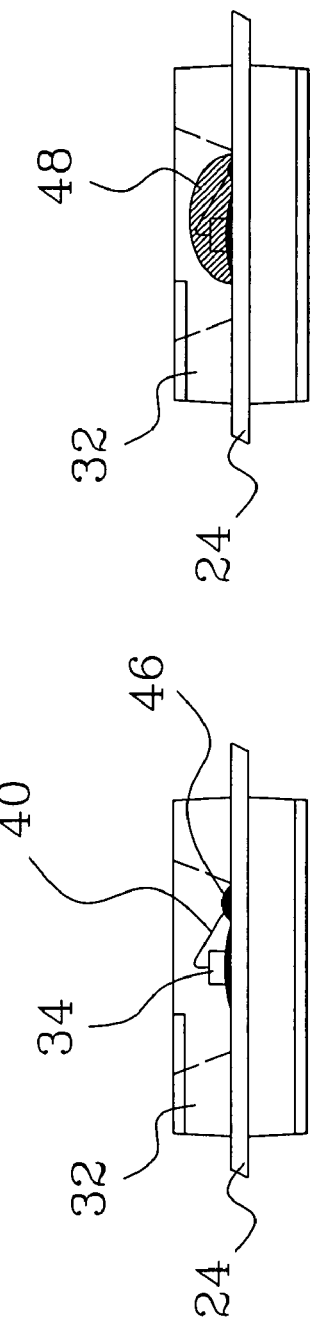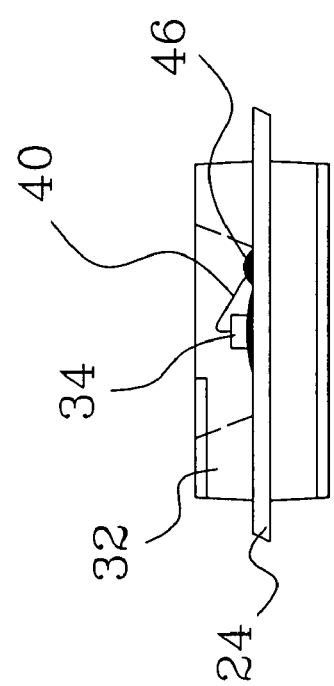
FIG. 11A
FIG. 11B
FIG. 10A
FIG. 10B

METHOD OF MANUFACTURING AN LED

FIELD OF THE INVENTION

The present invention relates to a method of manufacturing an LED (Light Emitting Diode) and, more particularly, a method of manufacturing an LED on a tape coppery metal strip.

BACKGROUND TO THE INVENTION

The choices of packaging methods, materials and packaging equipments for LED's mainly depend on the factors such as functions, electrical/photoelectric properties, precision, unit price, etc. of LED chips. The LED industry has been developed for several decades, and has gone through the developments of lead LED, chip SMD LED, power LED, high power LED, etc.

When manufacturing a single LED carrier with ceramic materials used as the carrier, it is hard to form circuits on the surface of the carrier; namely, it is hard to form circuit patterns on the carrier. Therefore, there have disadvantages of difficulty in manufacture, poor precision and high cost. If a metal material (such as copper) is used as the carrier, a mask should be made in advance; then, after the procedure of exposure, the unwanted areas are etched by etching so as to form circuit patterns on the carrier. Such a manufacturing method is time-consuming because of the drift of the precision of each mask due to the variability in position thereon. Generally speaking, when a large current passes through a diode die, it is possible that the die may be loosen and even detached or cracked due to the thermal stress effect of the diode die. Therefore, it is indeed an important issue to avoid or reduce the thermal stress.

SUMMARY OF THE INVENTION

The object of the present invention is to provide a method of manufacturing an LED, capable of improving the precision so as to facilitate the manufacture of an LED and effectively reduce the cost, as well as avoiding the diode die from being loosen or cracked due to the thermal stress effect thereof.

The method of manufacturing an LED according to the present invention comprises the steps of: forming a tape coppery metal strip; continuously pressing circuits on the tape coppery metal strip so as to form a carrier having circuit patterns of electric contacts on which the diode dies can be placed; next, electroplating a plurality of metal layers on the surface of the carrier; then, continuously injecting chemical materials having a high glass transition point such as polyphthalamide (PPA) to be molded on the carrier so as to form a protector having a designated shape; and fixing the diode die in the interior of the protector, and welding metal wires to connect the die pads and the terminal contacts of the carrier. Meanwhile, a conductive or non-conductive adhesive is dropped onto the bonding position between the metal wires and the terminals of the carrier, and a soft paste is further applied to cover the diode dies, the metal wires and the terminals.

BRIEF DESCRIPTION OF THE DRAWINGS

The present invention will now be described by referring to the accompanying drawings in which:

FIG. 1 is a diagram showing the tape coppery metal strip of the present invention;

FIG. 2 is an enlarged fragmentary diagram of the tape coppery metal strip shown in FIG. 1;

FIG. 3 is an enlarged fragmentary diagram of the circuit pattern on the carrier 24 shown in FIG. 2;

FIG. 4 is a sectional diagram of the carrier shown in FIG. 2;

FIG. 5A is a plan view of the carrier on which a protector is formed according to the present invention;

FIG. 5B is a side view of FIG. 5A;

FIG. 5C is another side view of FIG. 5A;

FIG. 6A and FIG. 6B are diagrams showing the protector of the present invention;

FIG. 10A is a diagram showing the adhesive is dropped on the bonding positions between the metal wires and the terminals according to the present invention;

FIG. 10B is a sectional diagram of FIG. 10A;

FIG. 11A is a diagram showing a soft paste is applied to cover the diode dies, the metal wires and the terminals according to the present invention;

FIG. 11B is a sectional diagram of FIG. 11A;

DESCRIPTION OF PREFERRED EMBODIMENTS

Figure 7A:
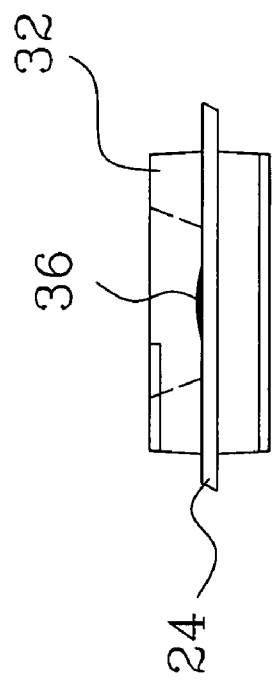
FIG. 7A is a diagram showing the adhesive is applied on the carrier according to the present invention.

FIG. 1 is a diagram showing the tape coppery metal strip of the present invention. As shown in FIG. 1, a tape coppery metal strip 20 is wound on a roller 22. Unlike the single strip used in the conventional art in which after the process for a single strip is finished, the finished single strip must be removed from the working table and replaced with a new single strip, the tape coppery metal strip 20 of the present invention can be continuously processed, such as continuous pressing, fixing dies, bonding, dropping soft paste, etc., on the working table until the end of the tape coppery metal strip is reached. Thus, using the tape coppery metal strip of the present invention can increase the yield, improve the efficiency and reduce the labor cost.

FIG. 2 is an enlarged fragmentary diagram of the tape coppery metal strip shown in FIG. 1. As shown in FIG. 2, by way of continuous pressing, the tape coppery metal strip 20 shown in FIG. 1 is formed as a carrier 24 having circuit patterns of electric contacts, on which diode dies (not shown) can be placed. The tape carrier 24 can have various sizes. Meanwhile, the circuit pattern on the carrier 24, as shown in FIG. 3 which is an enlarged fragmentary diagram of the circuit pattern on the carrier 24 shown in FIG. 2, can be designed to a desired circuit pattern according to the needs.

FIG. 4 is a sectional diagram of the carrier shown in FIG. 2. In order to increase the conductivity of the carrier 24, reduce the surface impedance thereof, enhance the lighting intensity and improve the capability of the soldering tin, a plurality of metal layers can be electroplated on the surface of the carrier 24. As shown in FIG. 4, nickel 26, silver 28 and tin 30 are individually electroplated on the surface of the coppery carrier 24 (gold can also be used), so that the above-mentioned functions can be achieved.

FIG. 5A is a plan view of the carrier on which a protector is formed according to the present invention, FIG. 5B is a side view of FIG. 5A, and FIG. 5C is another side view of FIG. 5A. As shown in these drawings, a protector 32 having a designated shape can be formed on the tape carrier 24 by way of continuous injection molding. As shown in FIG. 6A and FIG. 6B, which are diagrams showing the protector of the present invention, the height of the protector 32 formed on the carrier 24 is set to B; the diode die 34 is placed on the carrier 24, and the height from the bottom of the protector 32 to the top of the diode die 34 is set to A. The height B is higher than the height A. Thus, the diode die 34 and the carrier 24 can be integrally formed in the interior of the protector 32, so that the protector 32 can protect the diode die 34 to avoid from extruding damage, and various photodiodes with different functions can be placed on the designated areas. Further, the protector 32 is made of a heat-resistant chemical material of polyphthalamide (PPA) having a high glass transition point (Tg); this material can be used in the present invention so that the protector 32 can be manufactured easily by way of the injection molding of plastics, and the manufacturing method thereof has the advantages of high precision and low cost.

Figure 7C:
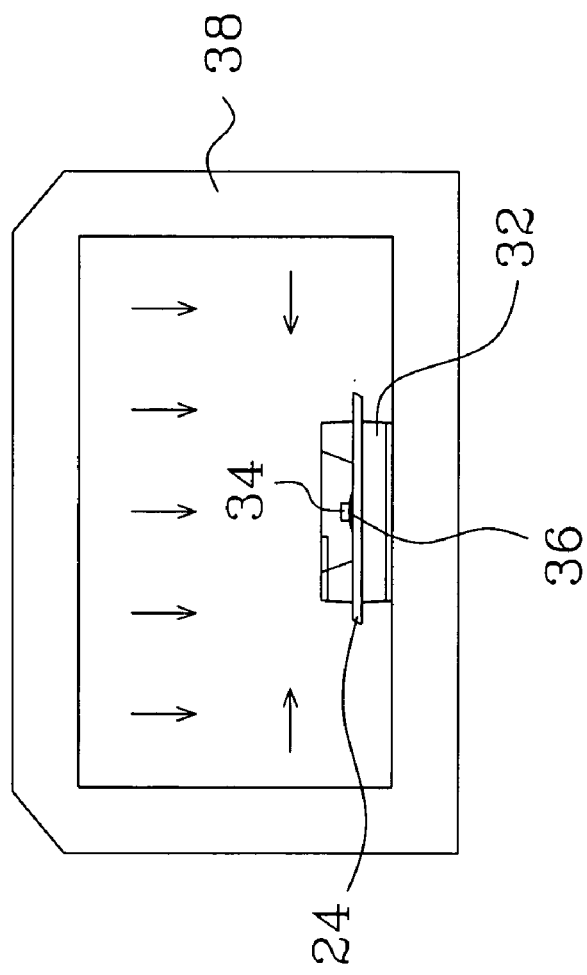
FIG. 7C is a diagram showing the diode die is baked to be cured and fixed on the carrier according to the present invention.
Figure 7B:
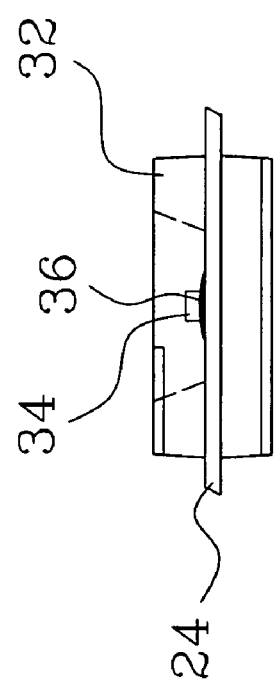
FIG. 7B is a diagram showing the diode die is adhered to the adhesive according to the present invention.
Figure 8A:
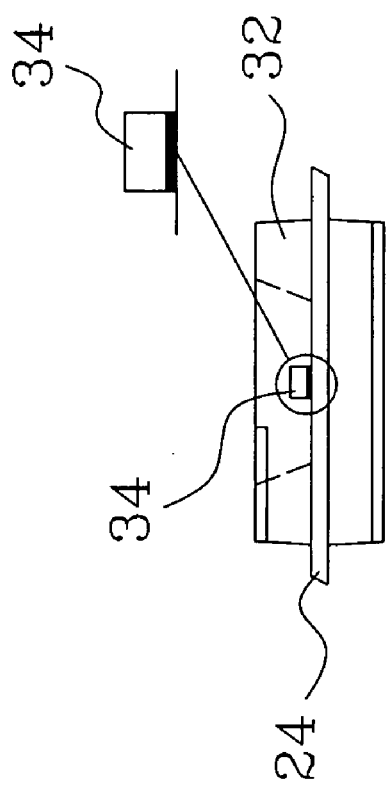
FIG. 8A is a sectional view showing the curing and fixing of the diode die by eutectic mounting according to the present invention.
Figure 8C:
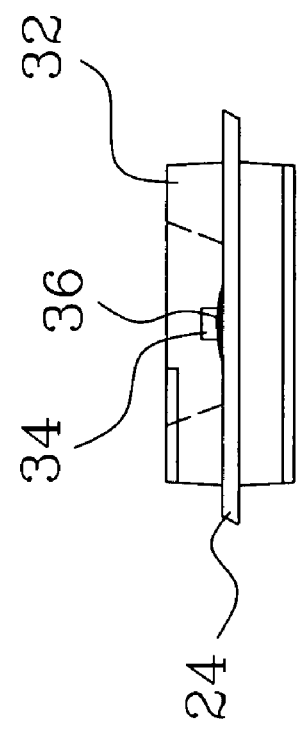
FIG. 8C is a sectional view showing the curing and fixing of the diode die by pick-up mounting according to the present invention.
Figure 8B:
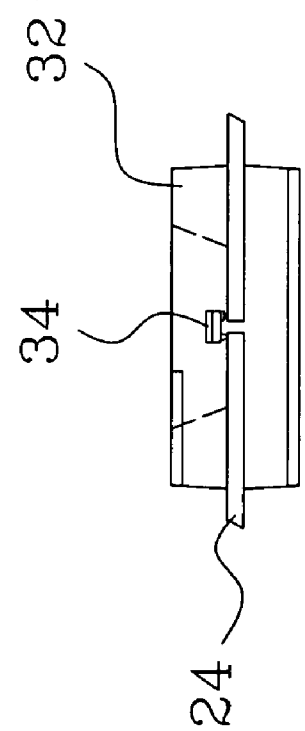
FIG. 8B is a sectional view showing the curing and fixing of the diode die by flip-chip mounting according to the present invention.

FIG. 7A is a diagram showing the adhesive is applied on the carrier according to the present invention, FIG. 7B is a diagram showing the diode die is adhered to the adhesive according to the present invention, and FIG. 7C is a diagram showing the diode die is baked to be cured and fixed on the carrier according to the present invention. As shown in these drawings, first, a conductive or non-conductive adhesive 36 is applied on the designated position of the carrier 24 where the diode die 34 will be placed; after being placed on said position, the diode die 34 is adhered by the adhesive 36, and then entirely put into the oven 38 to cure the adhesive 36 by the baking of the oven 38 which may be a hot air type oven, an infrared oven or a reflow oven. Further, the method of curing and fixing the diode die 34 on the carrier 24 includes eutectic method, flip chip method or pick up method. FIG. 8A to FIG. 8C are sectional views showing the curing and fixing of the diode die according to the present invention, of which FIG. 8A shows the eutectic method of curing and fixing the diode die, FIG. 8B shows the flip chip method of curing and fixing the diode die, and FIG. 8C shows the pick up method of curing and fixing the diode die.

Figure 9A:
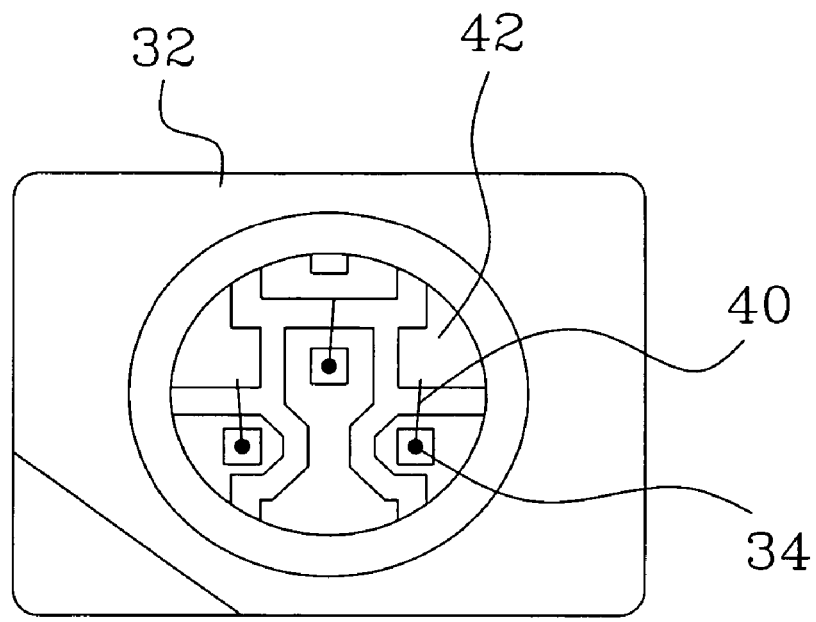
FIG. 9A is a diagram showing the bonding of the diode die of the present invention.
Figure 9B:
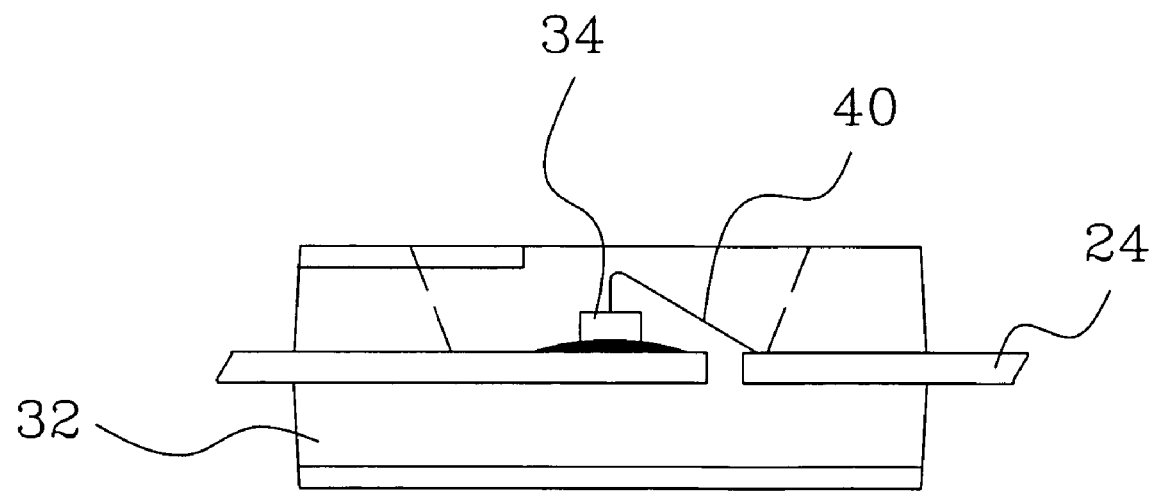
FIG. 9B is a sectional diagram of FIG. 9A.
Figure 14A:
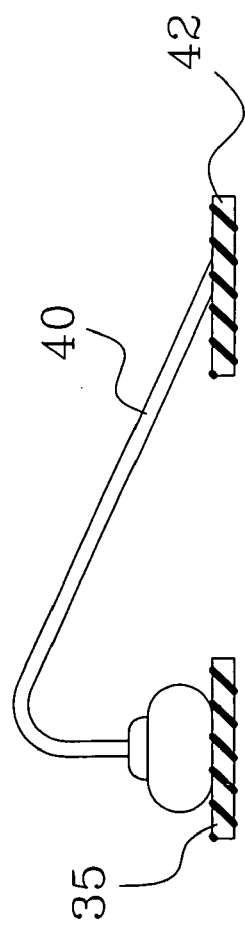
FIG. 14A-FIG. 14C are diagrams showing the ball on stick ball bonding according to the present invention.
Figure 14C:
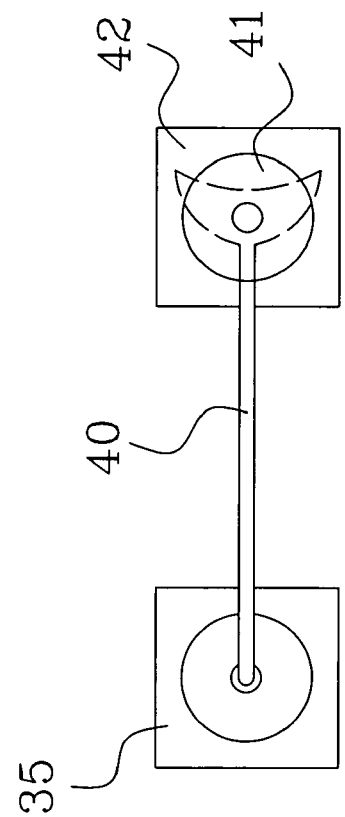
Figure 14B:
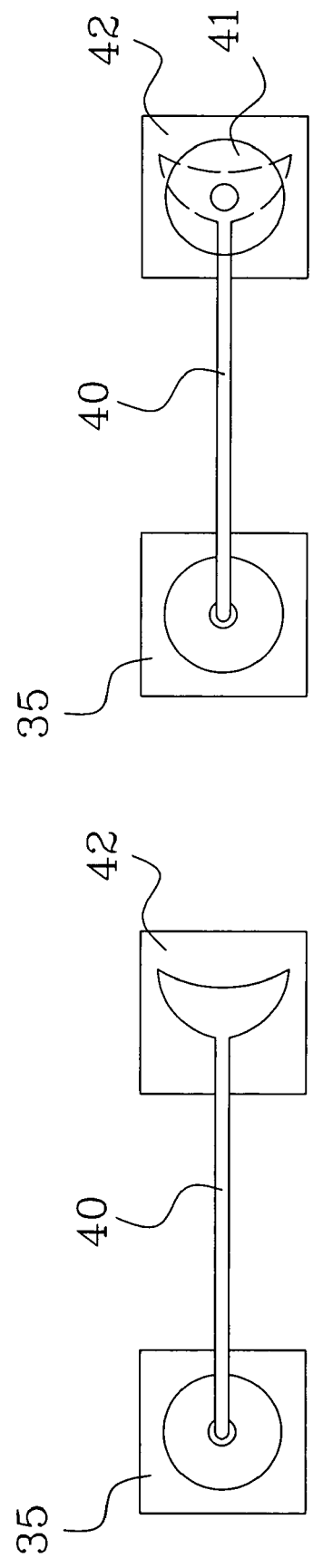

FIG. 9A is a diagram showing the bonding of the diode die of the present invention, and FIG. 9B is a sectional diagram of FIG. 9A. The cured and fixed diode die 34 should be subjected to the process of electrical connection; namely, a pad of the diode die 34 is electrically connected to a terminal 42 of the carrier by using metal wires 40 such as gold wires, aluminum wires or copper wires. The method for electrical connection includes the bonding methods such as ultrasonic bonding, ultrasonic thermo bonding, ball on stick ball bonding, etc., so that the metal wires 40 are electrically connected to the pad of the diode die 34 and the terminal 42 of the carrier, respectively. Further, the ball on stick ball bonding is shown in FIG. 14A to FIG. 14C. One end of the metal wire 40 assumes a ball shape and is pressed to connect with the pad 35 of the diode die 34. The other end of the metal wire 40 assumes a line shape and is pressed to connect with the terminal 42 so that the other end of the metal wire 40 is to assume the fishtail shape, and then a ball 41, the shape of which is like the ball-shaped end of the metal wire 40, is pressed onto the bonding position between the metal wire 40 and the terminal 42; namely, the fishtail-shaped end of the metal wire 40 is pressed to connect with the terminal 42. Thus, the connection effect between the metal wire 40 and the terminal 42 is enhanced so as to avoid the loosing, even detachment, of the metal wire 40 from the terminal 42.

FIG. 10A is a diagram showing the adhesive is dropped on the bonding positions between the metal wires and the terminals according to the present invention, and FIG. 10B is a sectional diagram of FIG. 10A. As shown in these drawings, a conductive or non-conductive adhesive 46 is dropped on the bonding positions between the metal wires 40 and the terminals 42 of the carrier 24 so as to enhance the strength of the connecting point between the metal wire 40 and the terminal 42 and increase the adhesive strength.

FIG. 11A is a diagram showing a soft paste is applied to cover the diode dies, the metal wires and the terminals according to the present invention, and FIG. 11B is a sectional diagram of FIG. 11A. As shown in these drawings, after the processes of bonding the diode dies 34 and the metal wires 40 and dropping the adhesive 46 thereon are finished, a soft paste 48 is further applied to cover the diode dies 34, the metal wires 40 and the terminals 42. The soft paste 48 is capable of absorbing the thermal stress of the diode dies 34 generated due to being electrified and of resisting the internal stress of the protector 32 to protect the diode dies 34, and thus the yield rate of LED can be increased. Moreover, a soft paste 48 incorporating chemical powders having a diffusive property or a light wavelength transformation function can be used.

Figure 12:
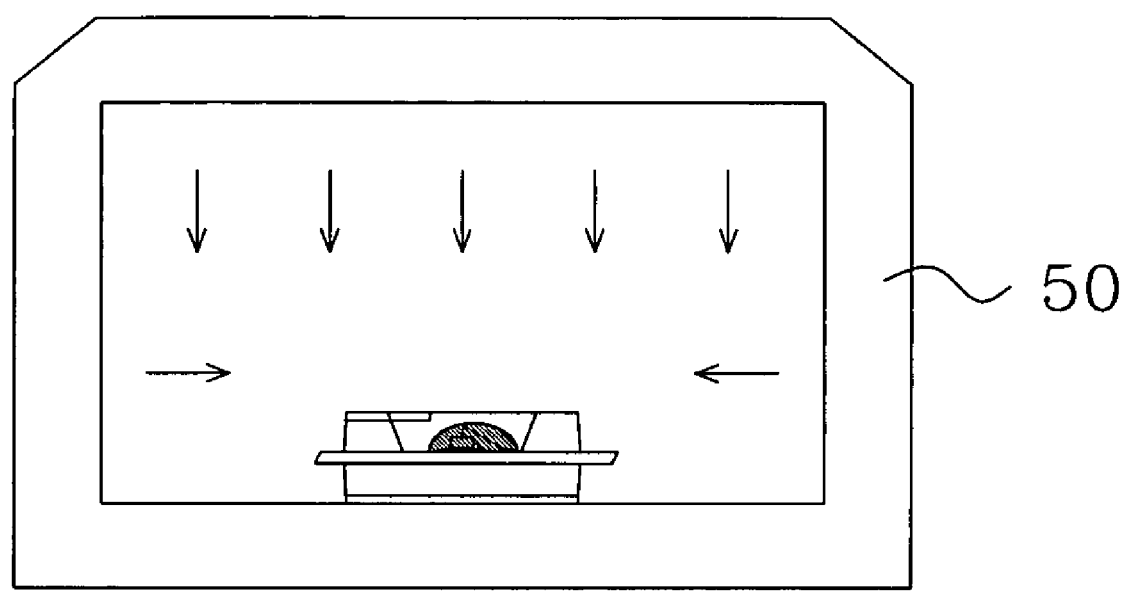
FIG. 12 is a diagram showing the oven for baking the adhesive and the soft paste of the present invention.

After the above-mentioned processes of applying the adhesive 46 and the soft paste 48 are finished, as shown in FIG. 12 which is a diagram of the oven for baking the adhesive and the soft paste according to the present invention, the LED which has gone through the above-mentioned processes is put into an oven 50 which may be a hot air type oven, an infrared oven or a reflow oven to cure the adhesive 46 and the soft paste 48 by the baking process.

Figure 13B:
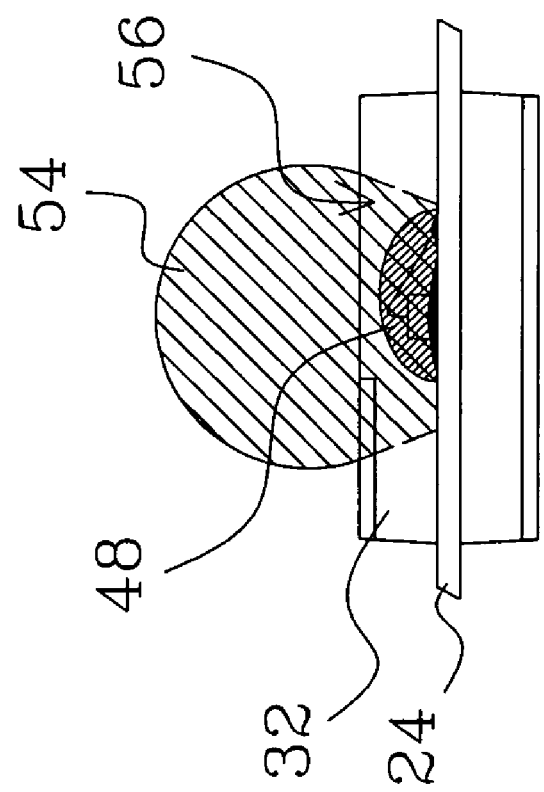
FIG. 13B is another diagram showing the resin is injected into the protector according to the present invention.
Figure 13A:
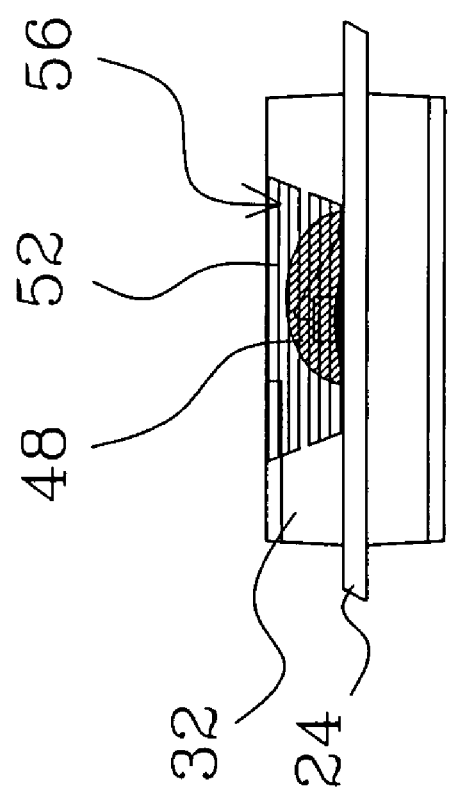
FIG. 13A is a diagram showing the resin is injected into the protector according to the present invention.

After the above-mentioned process of baking and curing the adhesive 46 and the soft paste 48 is finished, as shown in FIG. 13A which is a diagram showing the resin is injected into the protector according to the present invention, a protective resin 52 that is pervious to light is injected into the cave 56 of the protector 32 and onto the soft paste 48, the shape of which assumes a tangent plane with the top of the protector 32. The resin pervious to light can also assume other shapes; as shown in FIG. 13B which is another diagram showing the resin is injected into the protector according to the present invention, the resin 54 is injected into the cave 56 of the protector 32 and assumes a hemisphere on the top of the protector 32; alternatively, the injected resin can have a designed surface that has a prism effect (not shown). The purpose of injecting the protective resin pervious to light into the cave of the protector as mentioned above enables the LED having a better lighting efficiency and an excellent optical derivative property.

Although the manufacturing method of the present invention is explained by referring to a single LED in the above drawings for easy understanding, yet in an actual process, the LED is manufactured through a carrier formed by the tape coppery metal strip.

The method of manufacturing an LED of the present invention, capable of continuously carrying out the processes of pressing dies, injection molding and baking by using a tape coppery metal strip, can improve the precision, facilitate the manufacturing of an LED and effectively reduce the cost; meanwhile, the use of adhesives, soft pastes and resins can avoid the diode die from being loosen, detached or cracked due to the thermal stress effect thereof.

With the detailed description of the above-mentioned embodiment, it is desired to clearly describe the features and spirits of the present invention and should not be considered as a limitation on the scope of the present invention by the above-mentioned preferred embodiment; on the contrary, the purpose thereof is desired to cover various modifications and equivalent alterations under the scope of the appended claims of the present invention.

What is claimed is:

1. A method of manufacturing an LED, comprising:
    forming a tape coppery metal strip;
    continuously pressing circuits on said tape coppery metal strip so as to form a carrier having circuit patterns of electric contacts on which a plurality of diode dies are disposed;
    electroplating a plurality of metal layers on a surface of said carrier;
    continuously injection molding a substance on to said carrier so as to form a protector having a designated shape;
    fixing at least one of said diode dies in an interior of said protector on said carrier, and connecting a pad contact of said diode dies and a terminal contact of said carrier via a metal wire; and
    applying a soft paste to cover said diode dies, said metal wire, and said terminal contact, wherein said soft paste is capable of absorbing a thermal stress of said diode dies generated due to being electrified and of resisting an internal stress of said protector, thereby protecting said diode dies.

2. The method of manufacturing an LED as claimed in claim 1, wherein the plurality of metal layers are selected from the group consisting of gold, nickel, copper, silver and tin.

3. The method of manufacturing an LED as claimed in claim 1, wherein the substance is a heat-resistant chemical material of polyphthalamide having a high glass transition point.

4. The method of manufacturing an LED as claimed in claim 1, further comprising the steps of applying a conductive or non-conductive adhesive on a designated position of said carrier where the diode die will be placed; placing the diode die on said designated position of said carrier to be adhered by the adhesive; and then putting the LED entirely into an oven to cure the adhesive by baking.

5. The method of manufacturing an LED as claimed in claim 1, wherein said diode dies are fixed by one of a eutectic method, flip chip method or pick up method.

6. The method of manufacturing an LED as claimed in claim 1, further comprising the steps of electrically connecting the metal wire to the pad contact of said diode dies and the terminal contact of said carrier by a bonding method.

7. The method of manufacturing an LED as claimed in claim 6, wherein an adhesive is dropped onto a bonding position at the second end of the metal wire and the terminal contact of said carrier.

8. The method of manufacturing an LED as claimed in claim 7, wherein after applying the adhesive and the soft paste, the diode dies are put into an oven to be cured by baking.

9. The method of manufacturing an LED as claimed in claim 1, wherein the soft paste is incorporated with chemical powders having a diffusive property or a light wavelength transformation function.

10. The method of manufacturing an LED as claimed in claim 1, wherein a protective resin that is pervious to light is injected onto the soft paste forming a shape.

11. The method of manufacturing an LED as claimed in claim 1, wherein the soft paste is further capable of diffusing light or of transforming a light wavelength.

12. The method of manufacturing an LED as claimed in claim 4, wherein the oven is selected from the group consisting of a hot-air type oven, an infrared oven, and a reflow oven.

13. The method of manufacturing an LED as claimed in claim 6, wherein the metal wire is selected from the group consisting of gold wire, aluminum wire, and copper wire.

14. The method of manufacturing an LED as claimed in claim 6, wherein the bonding method is selected from the group consisting of ultrasonic bonding, ultrasonic thermo bonding, and ball-on-stick ball bonding.

15. The method of manufacturing an LED as claimed in claim 14 wherein the ball-on-stick ball bonding method includes ball bonding a first end of the metal wire onto the pad contact of said diode dies while a second end of the metal wire thereof is bonded onto the terminal contact of said carrier and then a ball is pressed onto a bonding position at the second end of the metal wire and the terminal of said carrier.

16. The method of manufacturing an LED as claimed in claim 8, wherein the adhesive is a conductive adhesive.

17. The method of manufacturing an LED as claimed in claim 8, wherein the adhesive is a nonconductive adhesive.

18. The method of manufacturing an LED as claimed in claim 9, wherein the oven is selected from the group consisting of a hot-air type oven, an infrared oven, and a reflow oven.

19. The method of manufacturing an LED as claimed in claim 11, wherein the shape is selected from the group consisting of a plane, a hemisphere, and a prism.

* * * * *